(12) United States Patent
Magome

(10) Patent No.: US 6,650,421 B2
(45) Date of Patent: Nov. 18, 2003

(54) METHOD AND APPARATUS FOR INSPECTING OPTICAL DEVICE

(75) Inventor: Nobutaka Magome, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/842,226

(22) Filed: Apr. 26, 2001

(65) Prior Publication Data

US 2001/0026367 A1 Oct. 4, 2001

Related U.S. Application Data

(63) Continuation of application No. 09/137,846, filed on Aug. 21, 1998, now abandoned.

(30) Foreign Application Priority Data

Aug. 26, 1997 (JP) .............................. 9-229142

(51) Int. Cl.$^7$ ................................. G01B 9/02
(52) U.S. Cl. ........................................ 356/521
(58) Field of Search ............... 356/354, 356, 356/521

(56) References Cited

U.S. PATENT DOCUMENTS 5,448,355 A * 9/1995 Noguchi et al. ............ 356/354
5,835,217 A * 11/1998 Medecki ..................... 356/353
6,100,978 A 8/2000 Naulleau .................... 356/354
6,151,115 A * 11/2000 Naulleau .................... 356/354

FOREIGN PATENT DOCUMENTS

JP 57-64139 4/1982

* cited by examiner

Primary Examiner—Frank G. Font
Assistant Examiner—Phil S. Natividad
(74) Attorney, Agent, or Firm—Armstrong, Westerman & Hattori, LLP

(57) ABSTRACT

In an interferometer for detecting interference light between light flux passed through an object to be inspected and reference light to be generated from a portion of the light flux passed therethrough, a phase of the interference light is detected with high precision. The light flux passed through the optical system to be inspected forms a spot image on a pinhole formed in a plate. Measuring light from the spot image and the reference-light diffracted out of the light flux from the spot image at the pinhole create interference light which in turn is received by an observation system. An image of interference fringes formed by the interference light is taken with an image pickup element. Further, heterodyne interference light is created by vibrating the plate in the direction intersecting the light flux or in the direction along the light path of the light flux, thereby detecting a phase of each portion of the interference fringes with high precision.

26 Claims, 4 Drawing Sheets

METHOD AND APPARATUS FOR INSPECTING OPTICAL DEVICE

This application is a continuation of Ser. No 09/137,846 filed Aug. 21, 1998 now abandoned.

BACKGROUND OF THE INVENTION

1. Field of the Invention

The present invention relates to a method and an apparatus for inspecting an optical device and, more particularly, it relates to a method and an apparatus for inspecting an optical device, which are suitable for inspecting a wavefront of ultraviolet rays, X-rays, etc., passing through a predetermined optical system.

2. Description of the Related Art

For exposure apparatuses so far employed in a lithography process for producing semiconductor elements and so on, there have been increasing demands to effect improvements in imaging features of an optical projection system for transcribing an image of a mask pattern onto a board such as a wafer, in order to enable finer and finer detail to be produced. In order to achieve such improvements, it is required to measure a status of wavefront aberration of an optical projection system with a high degree of precision so that a Twyman-Green interferometer and a Fizeau interferometer have hitherto been employed for inspecting a wavefront of laser beams, each of which uses He—Ne laser beams as an inspecting light as opposed to an exposing light employed conventionally. These measuring methods comprise measuring the status of a wavefront of light flux passed through an optical system to be inspected by causing the light flux passed through the optical device to be inspected to interfere with light flux from another reference plane by taking advantage of a very high interference performance inherent in He—Ne laser beams.

However, a measuring method using two light fluxeses with different light paths suffers from the disadvantage that interference fringes are likely to undergo an irregular distortion due to influences of vibration, large-scale optical parts of high precision are required to form a reference plane of high precision, and it is difficult to adjust the two light paths. Therefore, a point diffraction interferometer (PDI) is proposed (e.g. as disclosed in Japanese Patent Application Laid-open (Kokai) No. 57-64,139) which is so adapted as to create a reference light from a portion of the light flux passed through the optical projection system to be inspected. The prior art point diffraction interferometer can use even an exposing light intact as an inspecting light, which is not so high in interference performance, and can adjust a light path with ease, because the light path of a measuring light is almost equal to the light path of a reference light.

Particularly, as an exposing light (exposing light energy beams), there have recently been employed far ultraviolet rays such as ArF excimer laser beams (having wavelength of 193 nm), too, in addition to ultraviolet rays such as KrF excimer laser beams (having wavelength of 248 nm). Further, reviews have been made to use $F_2$ laser beams (having wavelength of 157 nm), soft X-rays (having wavelength of several tens nm to about 1 nm) or hard X-rays (having wavelength of below about 1 nm) as an exposing light. As the kind of glass materials having high transmission which can be applied to an exposing light with such short wavelengths are limited, the use of an optical projection system has been reviewed which combines e.g. a concave mirror or a plane mirror covered with a reflecting coating composed of a predetermined number of layers. Although quartz, fluorite and the like are known to be employed as glass materials for transmission of e.g. ArF excimer laser beams, it is required to improve performance of a transmission coating in order to enhance transmission of those materials when they are to be used as such glass materials. In order to inspect a wavefront of the optical projection system including characteristics of a reflecting coating or transmission coating, it is required to use an exposing light as an inspecting light. To this end, a point diffraction interferometer is suitable.

Such a point diffraction interferometer can present the advantages that an exposing light can be employed intact as an inspecting light and a light path can be readily adjusted upon effecting inspection of the wavefront of the optical projection system of the exposure apparatuses as stated above. Using this conventional point diffraction interferometer, however, it is difficult to measure a phase difference of interference fringes between certain two measurement points with high precision because such interference fringes yielded therewith remain static. Therefore, the conventional point diffraction interferometer poses the problems that it is difficult to further improve precision of inspecting the wavefront of the optical projection system and it is rather poor in the ability of reproducing results of inspection. In other words, as the conventional point diffraction interferometer can be provided with various advantages, it nevertheless is not sufficiently precise.

Likewise, among interferometers other than the point diffraction interferometer, an interferometer of the type (e.g. a zone plate interferometer) capable of producing a reference light from a portion of light flux passed through an optical system by taking advantage of an illuminating light (e.g., an exposing light, etc.) with which the optical projection system to be inspected is actually irradiated suffers from the defect that a SN ratio of interference fringes may be likely to become worse. Therefore, demands have been made to develop a technique for inspecting a phase of interference fringes at desired measurement points with high precision.

SUMMARY OF THE INVENTION

In light of the above, the present invention has a primary object to provide an inspection method and an inspection apparatus (an interferometer) for inspecting an optical device, which are so adapted as to detect a phase of interference light between light flux passed through the optical device as an object to be inspected and reference light to be produced from a portion of the light flux with high precision.

Further, the present invention has a second object to provide an inspection method and an inspection apparatus (an interferometer) for inspecting an optical device, which are adapted so as to detect a two-dimensional distribution of phases of interference light with high precision, even when there is employed a light flux having a lower interference performance as an illuminating light for detection.

The inspection method for inspecting the optical device in accordance with the present invention is directed to an inspection method for effecting inspection of a wavefront of light flux passed through the optical device, which comprises the step of passing the light flux through the optical device as an object to be inspected, and the step of producing a diffracting light from a portion of the light flux passed through the optical device through a diffracting element in the process of movement. The inspection method further comprises the step for detecting an interference light between the diffracting light and another light flux passed through the optical device during the movement of the diffracting element.

The diffracting element is a diffracting member having a pinhole shape, and it is preferred to generate the diffracting light with the pinhole-shaped diffracting member. The movement of the pinhole-shaped diffracting member may include vibration of the diffracting member in a direction intersecting the light flux passed through the optical device or vibration of the diffraction member in a direction along or parallel to the light flux passed through the optical device.

The inspection method for the optical device in accordance with the present invention comprises varying phases of the diffracting light generated by diffraction with the diffraction member by effecting the movement of the diffraction member. The diffracting light is a reference light having an ideal wavefront (an undistorted spherical plane). The movement of the diffraction member can periodically vary a phase difference between the diffracting light as a reference light and another light flux (having a wavefront distorted by influences of aberration with the optical device) passed through the optical device as an measuring light which is not diffracted by the diffracting light. The periodical variation in the phase difference between the diffracting light and the measuring light cannot only identify the direction of increasing or decreasing the degree of interference fringes (irregularity on a wavefront to be inspected) which could not be identified from static interference fringes obtained with the conventional point diffraction interferometers due to superimposition of fringes, but also interpolate a gap between the interference fringes to be created by interference between the diffracting light and the measuring light. Further, by comparing the phases of the interference light obtained at two locations, the phase difference in the interference light between the two locations can be detected with high resolution and precision. The interference light in this case is a heterodyne interference light.

The diffracting element may comprise a light path division device and a pinhole-shaped diffracting member, the light path division device being so adapted as to divide the light flux passed through the optical device into two light fluxes having different light paths and the pinhole-shaped diffraction member being disposed on the light path of one of the two light fluxes divided with the light path division device.

In this case, the light path division device is operated to move and the diffracting light is generated with the pinhole-shaped diffraction member during the movement of the light path division device. Further, during the movement of the light path division device, an interference light between the diffracting light generated with the pinhole-shaped diffraction member and the other light flux divided with the light path division device is detected. The light path division device may comprise, for example, a diffraction grating. The movement of the light path division device may comprise a continuous movement of the light path division device in a direction intersecting the light flux passed through the optical device.

When the diffraction grating as the light path division device is transferred continuously, the wavefront of the two light fluxes (diffracting light) divided with the diffraction grating are also transferred to effect frequency modulation, thereby changing a velocity of varying the phase of the wavefront of each light flux by the degree of the diffracting light, or periodically changing the phase difference of the two light flux generated from the diffraction grating. In this case, too, the interference light of the two light fluxes generated from the diffraction grating comprises a heterodyne interference light.

Moreover, the diffracting element may comprise a diffraction grating and a pinhole-shaped diffraction member, the diffraction grating being so adapted as to generate two light fluxes having different degrees of diffraction by diffraction of the light flux passed through the optical device and the pinhole-shaped diffraction member being disposed on the light path of one of the light fluxes generated from the diffraction grating.

In this case, the diffraction grating is operated to move and the diffracting light is generated with the pinhole-shaped diffraction member during the movement of the diffraction grating. During the movement of the diffraction grating, an interference light generated between the diffracting light generated with the pinhole-shaped diffraction member and the other light flux generated with the diffraction grating is detected. The movement of the diffraction grating may comprise a movement for stepwise transferring the diffraction grating by a predetermined pitch in the direction intersecting the light flux passed through the optical device.

Upon stepwise transferring the diffraction grating by a predetermined pitch, the phases of the two diffracting light are caused to change, thereby varying a phase difference of the resulting interference light periodically.

The optical device as an object to be inspected may comprise, for example, an optical projection device for projecting an image of a pattern formed on a first plane onto a second plane. The optical projection device may comprise an optical projection system disposed between a board and a mask in an exposure device for transcribing a pattern of the mask onto the board. The light flux incident into the optical device may comprise an exposing light to be irradiated upon the board through the mask and the optical projection system, and the exposing light may include ultraviolet rays or X-rays. Further, the optical projection system may comprise a reduced optical system having plural optical reflection elements.

Moreover, an alternative inspection method for inspecting an optical device in accordance with the present invention may include an inspection method for effecting inspection of a wavefront of light flux passed through the optical device, which may comprise a step for passing the light flux through the optical device as the object to be inspected, a step for changing a phase difference between a diffracting light obtained by diffracting a portion of the light flux passed through the optical device and the other light flux passed through the optical device, and a step for detecting an interference light between the diffracting light and the other light flux during the change of the phase difference between the diffracting light and the other light flux.

The portion of the light flux may be diffracted with the pinhole-shaped diffraction member. The phase difference between the diffracting light and the other light flux can be periodically changed by the movement of the pinhole-shaped diffraction member. The movement of the pinhole-shaped diffraction member may comprise vibration in the direction intersecting the light flux passed through the optical device or vibration in the direction along and in parallel to the light flux passed through the optical device.

On the other hand, the inspection apparatus for inspecting the optical device in accordance with the present invention may comprise a diffracting element for generating a diffracting light from a portion of the light flux, which is disposed on the light path of light flux passed through an optical device as an object to be inspected, a drive unit for driving the diffracting element, and a detection unit for receiving an interference light between the diffracting light and the other light flux passed through the optical device during movement of the diffracting element.

The diffracting element may comprise a pinhole-shaped diffracting member that generates the diffracting light. The drive unit may be configured so as to vibrate the pinhole-shaped diffraction member in the direction intersecting the light flux passed through the optical device or in the direction along and in parallel to the light flux passed through the optical device.

Further, the diffracting element may comprise a light path division device for dividing the light flux passed through the optical device into two light fluxes having different light paths, and the pinhole-shaped diffracting member for generating the diffracting light which is disposed on the light path of one of the two light flux divided with the light path division device. In this case, the light path division device may comprise a diffraction grating and the drive unit may be configured to continually transfer the light path division device in the direction intersecting the light flux passing through the optical device.

Moreover, the diffracting element may comprise a diffraction grating for generating two light fluxes having different diffraction degrees by diffracting the light flux passed through the optical device and a pinhole-shaped diffracting member for generating the diffracting light, which is disposed on the light path of one of the two light fluxes generated from the diffraction grating. In this case, the drive unit may be configured so as to stepwise transfer the diffraction grating by a predetermined pitch in the direction intersecting the light flux passed through the optical device.

Furthermore, an alternative inspection apparatus for inspecting the optical device in accordance with the present invention may comprise a diffracting element for generating a diffracting light from a portion of the light flux passed through the optical device as an object to be inspected, which is disposed on the light path of the light flux passed through the optical device, a unit for varying a phase difference between the diffracting light and the other light flux passed through the optical device, and a detection unit for detecting an interference light between the diffracting light and the other light flux during a variation in the phase difference with the unit. The diffraction member may comprise a pinhole-shaped diffraction member. The unit for varying the phase differences periodically may comprise, for example, a drive unit for vibrating the pinhole-shaped diffraction member in the direction intersecting the light flux passed through the optical device or in the direction along or in parallel to the light flux passed through the optical device.

Moreover, an alternative inspection apparatus for inspecting the optical device in accordance with the present invention may comprise a diffraction member in a pinhole form disposed on a light path of light flux (e.g., ultraviolet rays, X-rays, etc.) passed through or transmitted through or reflected from an object to be inspected, a drive system for vibrating the diffracting member in the pinhole form, and a detection system for receiving a heterodyne interference light between the light flux passed through the object to be inspected and the diffracting light generated with the diffracting member upon vibrating the diffracting member via the drive unit. The inspection apparatus is so configured as to detect optical characteristics of the object to be inspected on the basis of detection signals of the detection system (as illustrated in FIGS. 1 and 2).

The inspection apparatus according to the present invention can detect an interference light between the light flux passed through the object to be inspected as a measuring light and the diffracting light generated from a portion of the light flux with the diffracting member as a reference light. Upon this instance, a heterodyne interference light can be obtained by changing a phase of the reference light by vibrating the diffracting member in the direction (D1) intersecting the running direction of the light flux from the object to be inspected or in the running direction (D2) thereof. The phase difference of the interference light at two locations can be detected with high resolution and precision, for instance, by photoelectrically converting the heterodyne interference light at the two locations with the detection system and comparing the phases of resulting two detection signals (optical beat signals).

When the object to be inspected comprises, for example, an optical projection system for an exposure apparatus, a portion of the light flux passed through the object to be inspected is employed as a reference light in the present invention so that, even if the exposing light to be employed for the exposure apparatus would have poor interference performance, e.g., like X-rays, the exposing light can also be employed as light flux for use upon inspection. This enables measurement including influences of coating layers in the object to be inspected. Further, the distribution of the phases of the wavefronts in the object to be inspected can be detected by a fine pitch by receiving the heterodyne interference light with a two-dimensional image pickup element of a CCD type and comparing the phases of the image pickup signals from each pixel.

More specifically, this feature of the inspection apparatus according to the present invention can provide advantages that the heterodyne interference light can be obtained so that the phase of the interference light between the light flux passed through the object to be inspected and the reference light generated from a portion of the light flux can be detected with high precision. Further, as the reference light (diffracting light) is generated from the light flux passed through the object to be inspected, light flux which is poor in interference performance can also be employed as an illuminating light for use upon detection. Therefore, particularly when an inspection is effected for the wavefront of an optical projection system with an interferometer in accordance with the present invention, which is employed with an exposing light such as ultraviolet rays or X-rays, the exposing light can also be employed as an illuminating light for inspection so that aberration can be evaluated with high precision under actually applicable conditions. Furthermore, a two-dimensional distribution of the phases of the interference light can be detected with high precision by taking a picture of an image of interference fringes with a two-dimensional image pickup element and detecting the phase of each pixel.

Furthermore, an alternative inspection apparatus for inspecting the optical device in accordance with the present invention may comprise a light path division system for generating two light fluxes having different light paths from the light flux passed through an object to be inspected, a pinhole-shaped diffracting member disposed on a light path of one of the two light fluxes ($L_0$, $L_1$) generated from the light path division system, a drive unit for continually transferring the light path division system, and a detection system for receiving a heterodyne interference light between the other light flux generated from the light path division system upon continually transferring the light path division system through the drive unit and the diffracting light generated with the diffracting element. This configuration can detect optical characteristics of the object to be inspected on the basis of detection signals from the detection system (as illustrated in FIGS. 3 and 4).

In the inspection apparatus according to the present invention, there may be employed, for example, a diffraction grating as the light path division system, which may be configured so as to implement frequency modulation by transferring the wavefront of the diffracting light generated from the diffraction grating upon continuously transferring the diffraction grating in the pitch direction. A velocity of varying the phase of the wavefront may vary with the degree of the diffracting light so that the interference light of two light fluxes to be generated from the diffracting light in different directions becomes a heterodyne diffracting light, thereby enabling the phase difference between two measurement points to be detected with high precision, as achieved with the inspection apparatus (as illustrated in FIGS. 1 and 2).

Moreover, an alternative inspection apparatus for inspecting the optical device in accordance with the present invention may comprise a diffraction grating of a predetermined pitch which can generate two light fluxes ($L_0$, $L_1$) having different diffraction degrees by diffracting the light flux passed through the object to be inspected, a pinhole-shaped diffracting member disposed on a light path of one of the two light fluxes generated from the diffraction grating, a drive unit for transferring the diffraction grating, and a detection system for receiving an interference light to be generated between the diffracting light generated from the diffracting element and one of the two light fluxes ($L_0$, $L_1$) generated from the diffraction grating upon stepwise transferring the diffraction grating with the drive unit at a predetermined number of times by the predermined pitech of $1/n$ (where n is an integer equal to or larger than three). This inspection apparatus is so adapted as to detect optical characteristics of the object to be inspected on the basis of detected signals of the detection system (as illustrated in FIG. 5).

The inspection apparatus according to the present invention can change the phase of the diffracting light by transferring the diffraction grating in the pitch direction as with the inspection apparatus according to the present invention (as illustrated in FIGS. 3 and 4), thereby varying the phase of the resulting interference light, too. This feature can detect the phase of the interference light with high precision by calculating the intensity of the interference light obtained upon changing the diffraction grating in plural positions. More specifically, the inspection apparatus according to the present invention can present the advantages that the phase of interference fringes at a desired measurement point can be detected with high precision by calculating the resulting detected signals because the phase of the interference light is stepwise transferred by a predetermined pitch amount. Furthermore, it can provide the merits that there can also be employed, as an illuminating light for inspection, a light flux which cannot otherwise be preferably employed for that purpose due to the fact that its interference performance is poor.

On the other hand, a method for manufacturing an exposure apparatus in accordance with the present invention may include a method for manufacturing an exposure apparatus for transcribing an image of a pattern formed on a mask onto a board through an optical projection system, which may be provided with an inspection adjustment step which includes a step for passing an exposing light through the optical projection system and a step for passing the exposing light sent from the optical projection system through a diffracting element, which generates diffracting light from a portion of the exposing light sent from the optical projection system during the movement of the diffracting element. The inspection adjustment step may further contain a step for detecting interference light between the diffracting light and an other exposing light sent from the optical projection system during the movement of the diffracting element.

In the inspection adjustment step of the method for manufacturing the exposure apparatus according to the present invention, the phase of the diffracting light as a reference light can be varied by the movement of the diffracting element, thereby perioridcally varying the phase difference between the diffracting light and another exposing light as a measuring light sent from the optical projection system. Therefore, a wavefront aberration of the exposing light sent from the optical projection system can be inspected and measured with high precision on the basis of interference fringes generated by interference between the diffracting light and the other exposing light.

Furthermore, the exposure apparatus according to the present invention may comprise an exposure apparatus for transcribing an image of a pattern formed on a mask onto a board through an optical projection system, which may be provided with an optical inspection device comprising a diffracting element for generating diffracting light from a portion of an exposing light sent from the optical projection system as an object to be inspected, which is disposed on a light path of the exposing light, a drive unit for driving the diffracting element, and an inspection unit for receiving interference light between the diffracting light and the other exposing light sent from the optical projection system during the movement of the diffracting element.

BRIEF DESCRIPTION OF THE DRAWINGS

FIG. 4(*b*) is a view showing the manner in which a wavefront of the +n-th diffracting light advances by transferring a diffraction grating 22 from the state of FIG. 4(*a*).

DESCRIPTION OF THE PREFERRED EMBODIMENTS

A description will now be made of the configuration of the inspection device (an interferometer) for inspecting an optical device in accordance with the first embodiment of the present invention with reference to FIGS. 1 and 2. This embodiment is directed to the case where the present invention is applied to a point diffraction interferometer for inspecting a wavefront of an optical projection system to be installed in a projection exposure apparatus such as a stepper.

Figure 1:
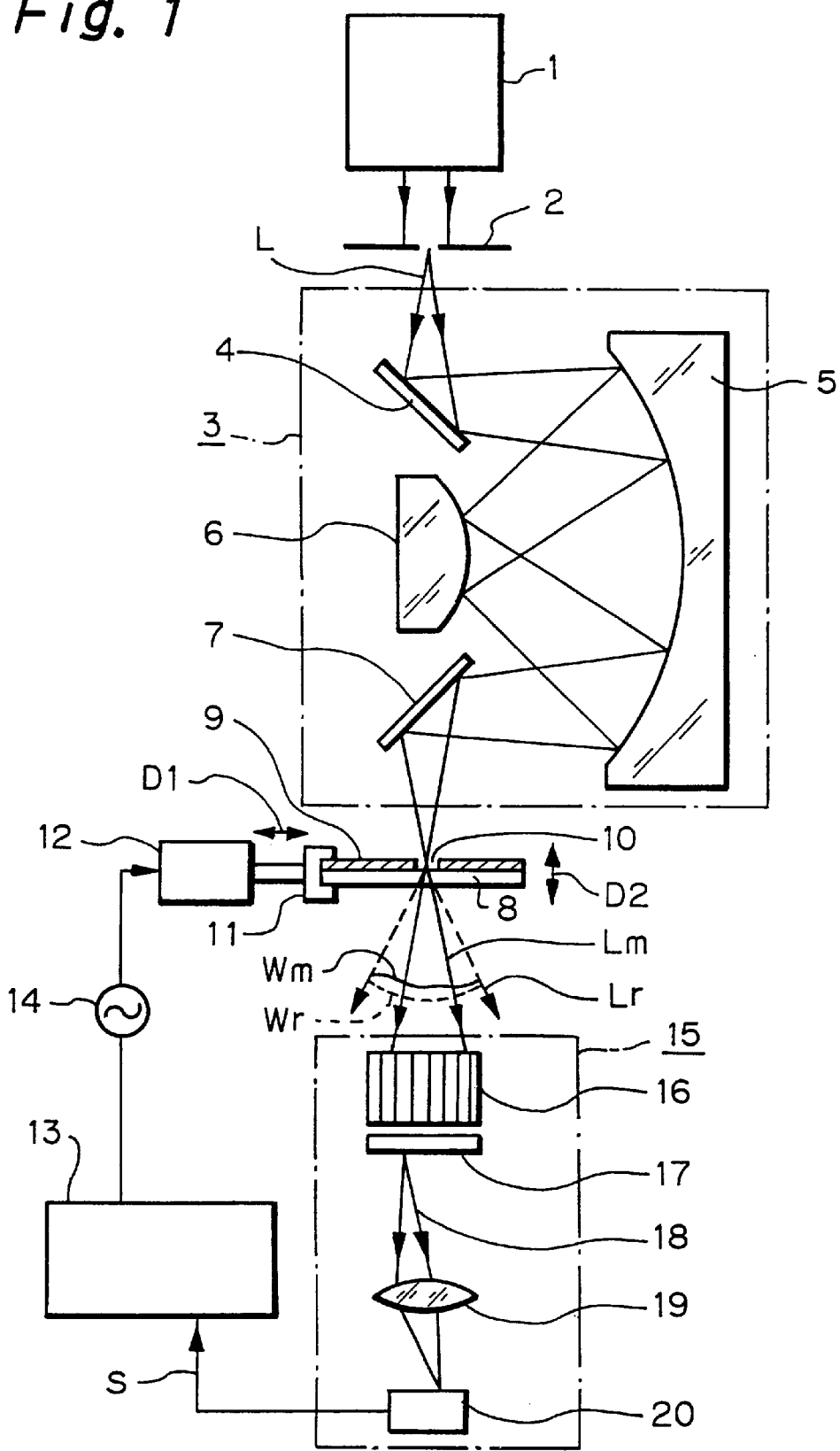
FIG. 1 is a schematic view showing a configuration of an inspection device (an interferometer) according to a first embodiment of the present invention.

FIG. 1 shows a point diffraction interferometer (PDI) according to this embodiment. As shown in FIG. 1, as an optical system 3 to be inspected as an object for inspection of a wavefront, there is installed an optical projection system of a projection exposure apparatus which uses ultraviolet rays such as ArF excimer laser beams or $F_2$ excimer laser or X-rays having wavelength of approximately 10 nm or shorter as an exposing light. The optical projection system to be used for this embodiment may comprise an imaging system comprised of a reflection system only. The imaging system may be configured such that the exposing light from a mask pattern (not shown) passes through a first mirror 4, a concave mirror 5, a convex mirror 6, a concave mirror 5 and a second mirror 7 and then reaches a wafer (not shown) with a photoresist coated thereon, thereby projecting an image of the mask pattern onto the wafer. On each of the reflecting surfaces of the mirrors 4 and 7, the concave mirror 5 and the convex mirror 6 is provided with a reflecting coating membrane comprised of multilayers in order to enhance the reflectance against ultraviolet rays or X-rays. In this embodiment, the exposing light is employed as it is as an inspecting light flux for measuring a wavefront aberration including influences of characteristics of the multilayered reflecting coating membrane and fine irregularity on the reflecting surface thereof.

It is to be noted herein that, when X-rays are to be employed as the exposing light and He—Ne laser beams are employed as the inspecting light flux, He—Ne laser beams are reflected on an upper layer of the multilayered reflecting membrane so that they cannot be used for inspecting the state in which the surface becomes worse, etc., resulting from the reflecting membrane of the lower layer. Further, as the wavelength of the He—Ne laser beams is longer by approximately 100 times than that of X-rays, precision for inspecting irregularities on the reflecting surface, etc., is caused to be reduced to a considerable extent. Therefore, the point diffraction interferometer according to this embodiment which uses the exposing light itself is more favorable in this respect, too, than the case where X-rays are employed as the exposing light together with He—Ne laser beams as the light flux for inspection.

As shown in FIG. 1, light flux L having a frequency range equal to an exposing light sent from a light source system 1 installed with a source of ultraviolet rays or X-rays illuminates a pattern plate 2 with a small circular opening formed therein to allow the light flux L to pass therethrough, and the light flux L passed through the circular opening of the pattern plate 2 forms an image (a dot image) of the opening on a plate 8 for point diffraction via the optical system 3 to be inspected. The plate 8 is comprised of a board through which the light flux L can be transmitted and an incident surface of the plate 8 is provided with a membrane 9 having a transmission rate with respect to the light flux L as small as 5% or less and capable of transmitting the light flux L to a slight extent. Further, the plate 8 is provided at its portion with a pinhole 10 that allows the light flux L to transmit. In this embodiment, the dot image through the optical system 3 is formed approximately on the pinhole 10 and a portion of the incident light flux L is diffracted at the pinhole 10 to be employed as reference light Lr, while the remaining light flux is allowed to transmit through a region containing the pinhole 10 to be employed as measuring light Lm. The reference light Lr and the measuring light Lm are incident onto an observation system 15 as interference light.

In this case, the pinhole 10 is formed in a size smaller than the dot image to be formed, and a wavefront of the reference light Lr generated from the pinhole 10 as diffracting light becomes an ideal spherical wave Wr for the dot image. By observing a distribution of phases of an interference fringes obtainable by interference of the spherical wave Wr with a wavefront Wm of the measuring light Lm by means of the observation system 15, the wavefront Wm of the measuring light Lm, that is, deviations (wavefront aberration, etc.) of the wavefront of the light flux passed through the optical system 3 to be inspected can be measured. In the observation system 15 the interference light consisting of the reference light Lr and the measuring light Lm is incident to a microchannel plate (MCP) 16. The microchannel plate 16 comprises a large number of minute elements disposed tightly in a two-dimension, the minute elements capable of generating electron beams in the amount corresponding to the energy of beams incident to each of the elements. The outgoing surface of the microchannel plate 16 is provided with a fluorescent plate 17 generating e.g. fluorescence of a visible region by irradiation with electron beams, and the fluorescence 18 generated from the fluorescent plate 17 forms interference fringes on an image pickup surface of a two-dimensional image pickup element 20 of a CCD type, etc., through an objective lens 19.

On the fluorescent plate 17 is formed interference fringes by a visible light having an energy distribution in proportion to interference fringes by ultraviolet rays or X-rays to be formed on the incident surface of the microchannel plate 16. Further, as the fluorescent plate 17 is conjugated with the image pickup surface of the image pickup element 20, the image pickup surface thereof is formed with interference fringes resembling the interference fringes formed on the incident surface of the microchannel plate 16. Image pickup signals S of the image pickup element 20 are transmitted to a control unit 13 comprised of a computer, and the control unit 13 processes the image pickup signals S and detects a phase difference of the interference fringes at each portion with respect to a reference point.

When the light flux L comprises ultraviolet rays such as ArF excimer laser beams, an image pickup element such as a CCD type image pickup element has some sensitivity to such ultraviolet rays so that the image pickup element may also be disposed directly in place of the microchannel plate 16. On the other hand, when the light flux L comprises X-rays, an X-ray fluorescent plate may be disposed in place of the microchannel plate 16 and an the image pickup element may be disposed on a back side thereof.

Although the image pickup element 20 outputs image pickup signals S of interference fringes generated by interference of the reference light Lr with the measuring light Lm, it is difficult to detect a phase difference between two points with high precision in such a state that the interference fringes stay static. Particularly, in the configuration as illustrated in FIG. 1, little interference fringes are caused because both the measuring light Lm and the reference light Lr become a spherical wave each having almost the same spherical center in such a state that wavefront aberration hardly exists due to excellent imaging performance of the optical system 3 to be inspected. In such a case, too, in this embodiment, the interference light between the reference light Lr and the measuring light Lm can be made to be a heterodyne interference light that varies intensity with time by vibrating the plate 8, in order to detect a phase difference between two points with high precision.

Therefore, an excitation unit 12 is connected to the plate 8 through a support member 11 and the plate 8 can be vibrated at a predetermined amplitude in the direction D1 intersecting the incident light flux L by driving the excitation unit 12 through an oscillation circuit 14 by the control unit 13. The amplitude of the vibration of the plate 8 is set to such an extent to fail to deviate the pinhole 10 from the dot image to be formed by the incident light flux L, and a frequency of the vibration thereof is set to become lower than a sampling frequency for reading image pickup signals of a one image screen one after another with the image pickup element 20. As the excitation unit 12, there may be employed, for example, a voice coil motor or a piezoelectric element. Upon vibrating the plate 8 in the direction D1 intersecting the incident light flux L in the manner as described above, the center of the spherical wave Wr of the reference light Lr is allowed to vibrate in the same direction D1 so that the resulting interference fringes (a variation of darkness and in the case of FIG. 1) is also caused to vibrate in the same direction D1. Therefore, when the plate 8 is moving in a one direction during its vibration, the resulting interference fringes move in that direction too, so that the control unit 13 reads the image pickup signals corresponding to a one image screen from the image pickup element 20 one after another in synchronization with the movement of the resulting interference fringes and stores the signals in an internal image memory. Thereafter, the control unit 13 reads the image pickup signals (signals varying almost in a sine wave form) corresponding to, for example, two measured points from the internal image memory and calculates a phase difference between the two image pickup signals, thereby obtaining a phase difference of the interference fringes at the two measured points with high precision.

The plate 8 may also be configured so as to vibrate in the direction D2 along or in parallel to the incident light flux L. The vibration of the plate 8 (the pinhole 10) in the direction D2 causes creating concentric interference fringes on the image pickup surface of the image pickup element 20 and the resulting interference fringes move as if they flow out from the center or they are absorbed therein. Therefore, when e.g. several images of an interference fringes are taken with the image pickup element 20 during a period of time, for example, when the phase of the interference fringes changes by 360°, and several sheets of images of the interference fringes are analyzed with the control unit 13, a two-dimensional distribution of the phases can be obtained. Upon this instance, e.g. by supplementing the image pickup signals of the several sheets of the images of the interference fringes with a sinewave-form function, the distribution of the phases can be obtained with high precision. Likewise, resolution in the measuring positions can be improved by supplementing a phase between each of pixels.

Figure 2A:
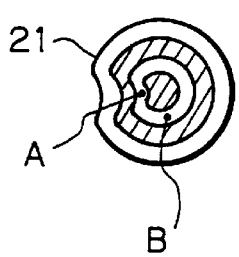
FIG. 2 is a view showing interference fringes obtainable according to the first embodiment and image pickup signals obtainable at two points of the interference fringes.
Figure 2B:
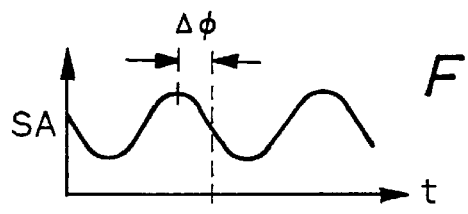
Figure 2C:
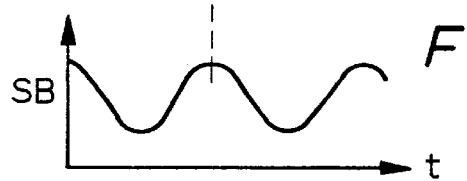

FIG. 2(a) shows interference fringes 21 which can be observed at a certain location with the image pickup element 20 when the plate 8 is vibrated in the direction D2 along the light flux L as shown in FIG. 1. In FIG. 2(a), the interference fringes 21 change in a concentric way while a portion thereof is caused to distort by a wavefront aberration of the optical system 3 to be inspected. In this case, for example, when a phase difference at measured positions A and B which are located in the same distance from the center and spaced apart by 90° in the circumference direction, image pickup signals SA and SB as shown in FIGS. 2(b) and 2(c), respectively, can be obtained by arranging the image pickup signals read from the pixels at the measured positions A and B in a time series, out of the image pickup signals obtained by taking pictures of images of interference fringes. Actually, the image pickup signals are obtained in a discrete state at predetermined time intervals and the image pickup signals SA and SB are obtained by approximating the obtained image pickup signals with a sine wave. In this case, a phase difference $\Delta\phi$ between the image pickup signals SA and SB can be obtained with extremely high resolution and precision so that as a consequence a phase difference $\Delta\phi$ of the intereference fringes at the measured points A and B can also be measured with high precision. Further, for example, by obtaining a phase difference at other measureming points with reference to the phase of the center of the interference fringes 21 as shown in FIG. 2(a), a distribution of the phases of the interference fringes 21 at each point can also be obtained with high precision, thereby enabling an inspection of the wavefront of the optical system 3 to be inspected as shown in FIG. 1 on the basis of the phase distribution.

In this embodiment, as the heterodyne interference light is obtained by vibrating the plate 8 (the pinhole 10) in the manner as described above, the phase distribution of the interference fringes can be measured with high precision while taking advantage of the merits that the measurement can be conducted using the actual exposing light of the point diffraction interferometer.

Figure 3:
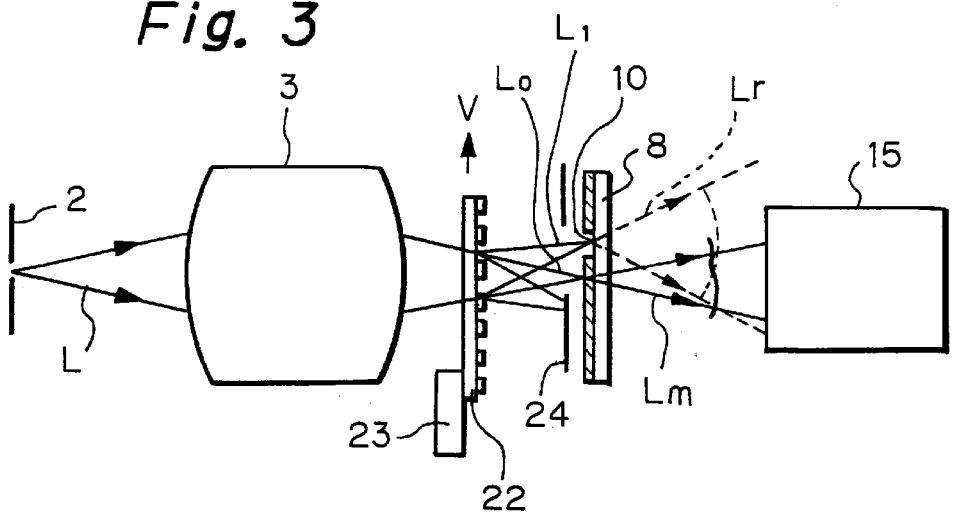
FIG. 3 is a schematic view showing a configuration of an inspection device (an interferometer) according to a second embodiment of the present invention.

Then, a description is made of modes of the second embodiment with reference to FIGS. 3 and 4. In the mode of the embodiment as shown in FIG. 1, there is the risk that no interference fringes are created when the optical system 3 to be inspected has good imaging characteristics, thereby causing a reduction in the sensitivity to detection, because both the reference light Lr and the measuring light Lm form similar wavefronts. Therefore, in this embodiment, as disclosed in Japanese Patent Application Laid-opne (Kokai) No. 57-64,139, the spherical center of the reference light is shifted relative to a spot image by the optical system to be inspected and the heterodyne technology according to the present invention is applied.

FIG. 3 shows a point diffraction interferometer (PDI) for use in the embodiment of the present invention and the identical reference numerals and symbols are provided on the parts corresponding to those as shown in FIG. 1. As shown in FIG. 3, a diffraction grating 22 is disposed between the optical system 3 to be inspected and the plate 8 with the pinhole 10 formed therein, and a douser 24 for dousing diffracting light other than 0-th light and +n-th diffracting light (reference symbol 'n' being an integer equal to or larger than 1) from the diffraction grating 22 is disposed between the diffraction grating 22 and the plate 8. When the wavelength is particularly short as in the case where X-rays are employed as the light flux L, crystal that can cause diffraction of X-rays may be employed as the diffraction grating 22.

The light flux L passed through an opening of the pattern plate 2 is then converged with the optical system 3 to be inspected and reaches the diffraction grating 22 and the 0-th light ($L_0$ passed through the diffraction grating 22 forms a spot image on a membrane on the surface of the plate 8, which has a small transmittance. Out of the light flux sent from the spot image, the measuring light Lm as light flux passed through the membrane on the plate 8 is incident into the observation system 15. On the other hand, the +n-th diffracting light $L_1$ of the light flux L from the diffraction grating 22 is converged on the pinhole 10 of the plate 8 and the reference light Lr comprised of spherical waves diffracted with the pinhole 10 is incident into the observation system 15 as interference light, together with the measuring light Lm. In this embodiment, as the spherical center (spot image) of the wavefront of the measuring light Lm is apart from the spherical center of the wavefront of the reference light Lr in a sufficient distance, the interference fringes obtainable when there is no aberration in the optical system 3 to be inspected become parallel to and equal in distance to each other. Moreover, when there is a wavefront aberration in the optical system 3 to be inspected, the distances of the fringes may become irregular so that the wavefront can be inspected with ease.

It is to be noted herein that when the interference fringes are static, it is difficult to detect the phase difference between different measurement points with high precision. Therefore, as shown in FIG. 3, a drive unit 23 such as a linear motor, etc., may be disposed on the diffraction grating 22 to allow the diffraction grating 22 to move in the pitch direction at a constant velocity V at the time of measurement of the interference fringes and to subject the +n-th diffracting light L1 to frequency modulation (i.e. phase modulation) to produce heterodyne interference light.

Figure 4A:
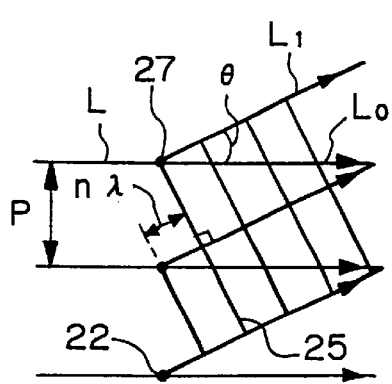
FIG. 4(*a*) is a view showing 0-th light and +n-th diffracting light at a certain point of time according to the second embodiment of the present invention.

FIG. 4 shows the manner in which the +n-th diffracting light L, is modulated by the movement of the diffraction grating 22. First, in the state as shown in FIG. 4(a), a diffraction angle θ can satisfy the following equation (1):

$$P \cdot \sin \theta = n \cdot \lambda \qquad (1)$$

where P is the pitch of the diffraction grating 22; and λ is the wavelength of the light flux L.

Figure 4B:
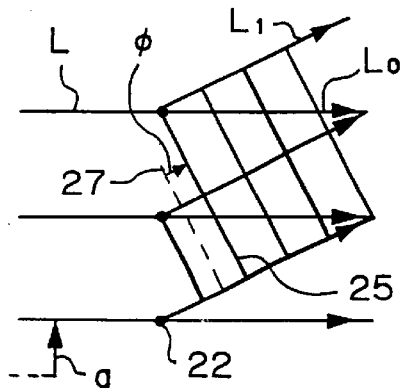

Further, supposed that the wavefront of the 0-th light $L_0$ in the position 27 at the point of time as shown in FIG. 4(a) has a phase equal to the wavefront 25 of the +1-st diffracting light $L_1$ and the phase is indicated by $\phi_0$, the amplitude D between the 0-th light $L_0$ and the 1-st diffracting light $L_1$ in the position 27 can be indicated by $\sin(\phi_0)$. Then, FIG. 4(b) shows the state in which the time t has elapsed from the state as shown in FIG. 4(a). In this state, the diffraction grating 22 is transferred in the pitch direction by reference symbol a(=V·t) so that an amount φ of transferal of the phase of the wavefront 25 of the +1-st diffracting light $L_1$ can be indicated by the following equation (2):

$$\phi = 2\pi \cdot n \cdot a / P \qquad (2)$$
$$2\pi(n \cdot V / P)t.$$

Further, when the frequency of the light flux L is indicated by f, the amplitude of the 0-th light in the position 27 as shown in FIG. 4(b) can be represented by $\sin(2\pi \cdot ft + \phi_0)$ Moreover, the amplitude D' of the 1-st diffracting light $L_1$ can be represented by the following equation (3):

$$D' = \sin(2\pi \cdot ft + \phi_o - \phi) \qquad (3)$$
$$= \sin\{2\pi(f - nV/P)t + \phi_o\}.$$

It can be found from this equation that the reference light Lr comprised of the +1-st diffracting light L1 from the diffraction grating 22 undergoes frequency modulation by nV/P with respect to the measuring light Lm so that the intensity of the heterodyne interference light composed of the reference light Lr and the measuring light Lm is converted into sine waves at the frequency of nV/P. Therefore, by sampling image pickup signals of the interference fringes by frequency higher than the frequency of nV/P with the image pickup element 20 in the observation system 15 (as shown in FIG. 1), the phase of the resulting interference fringes (e.g. a phase difference on a basis of the center of the interference fringes) at each portion can be detected with high precision.

Figure 5:
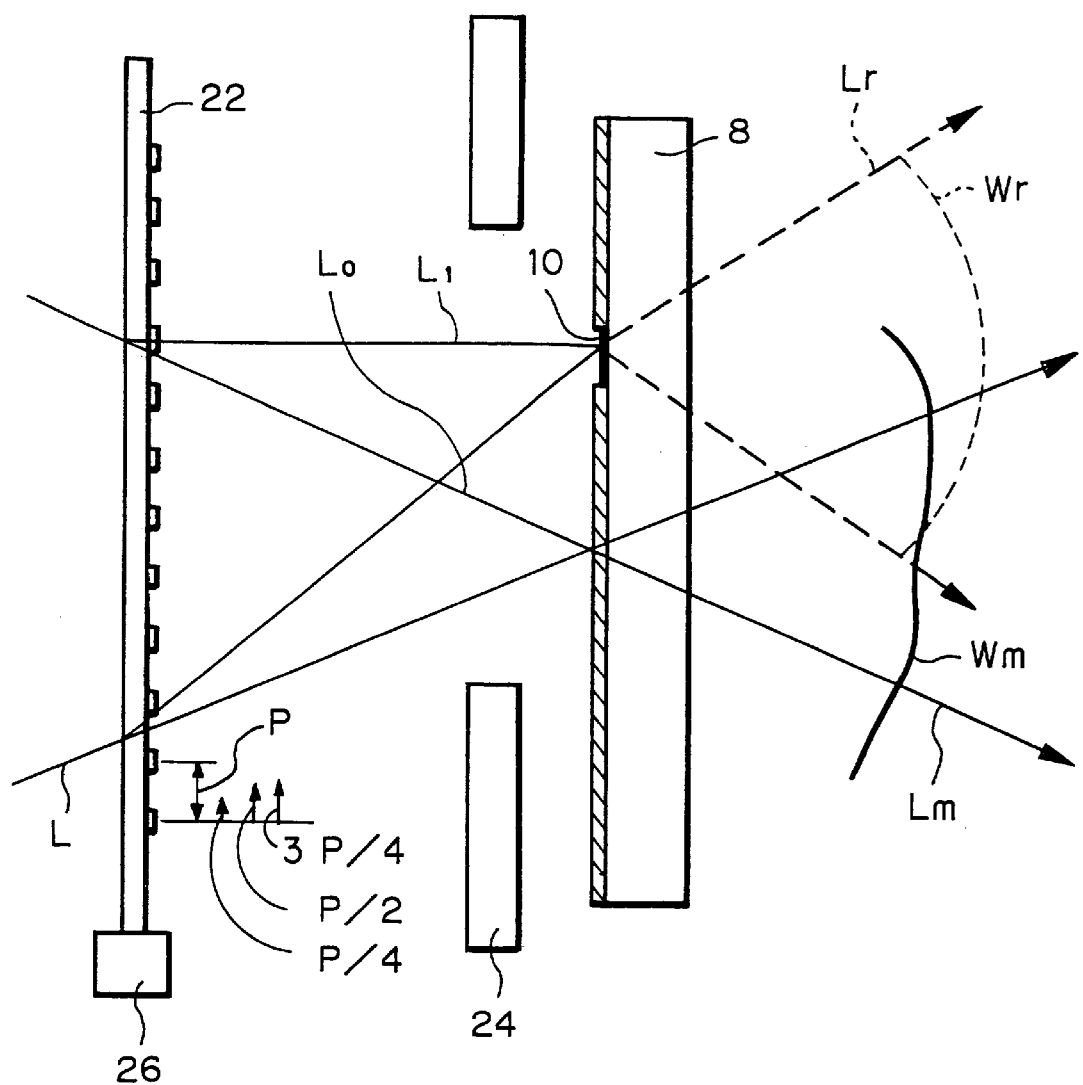
FIG. 5 is an enlarged view showing the essential portion of an inspection device (an interferometer) according to a third embodiment of the present invention.

Then, a description will be made of the mode of the third embodiment of the present invention with reference to FIG. 5. In the mode of the embodiment as shown in FIG. 3, the heterodyne interference light is created by transferring the diffraction grating 22. On the other hand, in this mode, an image of the interference fringes is taken by transferring the diffraction grating 22 step-by-step in a predetermined distance. In FIG. 5, the portions corresponding to FIG. 3 are provided with the identical reference numerals and symbols and a description of those corresponding portions will be omitted hereinafter.

FIG. 5 shows a point diffraction interferometer according to this embodiment of the present invention. As shown in FIG. 5, a portion of the 0-th light $L_o$ passing through the diffraction grating 22 passes through a membrane of the plate 8 and becomes measuring light Lm having a wavefront Wm, while a portion of the +n-th diffracting light Lr (where the reference symbol n is an integer equal to or larger than 1) from the diffraction grating 22 becomes reference light Lr composed of spherical waves Wr by diffraction with the pinhole 10 on the plate 8. Thereafter, images of the interference fringes resulting from synthesis of the reference light Lr and the measuring light Lm are taken with the image pickup element in the observation system 15 as shown in FIG. 3.

Further, the diffraction grating 22 in this embodiment may be configured such that it is fixed to a drive element 26 comprised of, e.g. piezo element, etc., and the diffraction grating 22 can be transferred stepwise by a minute distance in the pitch direction. In this embodiment, as an example, an image of interference fringes is taken when the diffraction grating 22 is stayed static in an initial state, followed by taking pictures of images of the interference fringes created whenever the diffraction grating 22 is transferred in the pitch direction by an amount of P/4 (90° each as a phase difference). In this instance, the interference fringes created when the diffraction grating 22 has stopped at each point can also be regarded as heterodyne interference light. Further, when the phase of the interference fringes at a desired measurement point in the initial state of the diffraction grating 22 is indicated by Θ, the intensity I(0) of the interference fringes at that measurement point in the initial state of the diffraction grating 22 and the intensity I(90) of the interference fringes after the diffraction grating 22 was transferred by P/4 can be represented using a predetermined amplitude $I_o$ by the following equations (4) and (5), respectively:

$$I(0) = I_o \sin \Theta \qquad (4)$$

and $$I(90) = I_o \sin (\Theta + 90°) = I_o \Theta) \qquad (5).$$

It can be noted herein that the intensities I(0) and I(90) actually contain offset amounts and that the offset amounts can be computed, e.g. by averaging the image pickup signals of the pixels in a predetermined region. Therefore, if it is supposed that the offset amounts are subtracted from the equations (4) and (5), the following equation can be given by dividing the equation (4) with the equation (5):

$$\tan \Theta = I(0)/I(90).$$

From this, the phase Θ at that measurement point can be computed from the intensities I(0) and I(90) in the manner as follows:

$$\Theta = \arctan \{I(0)/I(90)\} \qquad (6).$$

Therefore, the phase of the interference fringes at each point can be computed from the equation (6) above by using the image pickup signals of the two interference fringes so that as a consequence a distribution of the phases can be computed with high precision.

It is to be noted herein that it is in fact desired to take images of interference fringes at 0°, 90°, 180° and 270° in order to accurately determine a direct current component of the interference fringes. At this end, in FIG. 5, it may be possible to take images of the interference fringes in the initial state of the diffraction grating 22 and in the states in which the diffraction grating 22 are transferred by P/4, by P/2 and by 3P/4, respectively. When the phase of the interference fringes at the desired measurement point in the initial state of the diffraction grating 22 is set to be $\Theta$, the respective intensities I(0), I(90), I(180) and I(270) of the interference fringes at the phases of 0°, 90°, 180° and 270° can be given by using a predetermined offset DC, as follows:

$$I(0) = I_o \sin\Theta + DC; \tag{7}$$

$$I(90) = I_o \sin(\Theta + 90°) + DC \tag{8}$$
$$= I_o \cos\Theta + DC;$$

$$I(180) = I_o \sin(\Theta + 180°) + DC \tag{9}$$
$$= -I_o \sin\Theta + DC; \text{ and}$$

$$I(270) = Io \sin(\Theta + 270°) + DC \tag{10}$$
$$= -Io \cos\Theta + DC.$$

From these equations, the following equation can be given:

$$\tan\Theta = [I(0)-I(180)]/[I(90)-I(270)].$$

Therefore, the phase $\Theta$ at that measurement point can be accurately computed, e.g. from the four intensities I(0), I(90), I(180) and I(270) by the equation (11) as follows:

$$\Theta = \arctan\{[I(0)-I(180)]/[I(90)-I(270)]\} \tag{11}.$$

In the modes of the embodiments as shown in FIGS. 1 to 5, an optical projection system comprised of a reflection system is employed as the optical system 3 to be inspected, e.g. as shown in FIG. 1. Needless to say, however, a refraction system or a reflection-refraction system may comprise the optical system to be inspected. Further, the optical system to be inspected may be an optical system that cannot form a spot image, i.e. a focus. In this case, the optical system may be configured such that a spot image can be created by locating an optical convergence system between the optical system to be inspected and the pinhole 10, which has a negligibly minute aberration or whose aberration is measured with high precision.

Moreover, as the optical system 3 to be inspected, there may be employed e.g. an illuminating system other than the optical projection system, or other optical observation systems. In addition, it is to be noted herein that the present invention can be applied to a general category of interferometers using a portion of light flux passed through the optical system to be inspected (an object to be inspected) as well as interferometers of a point diffraction type.

Figure 6:
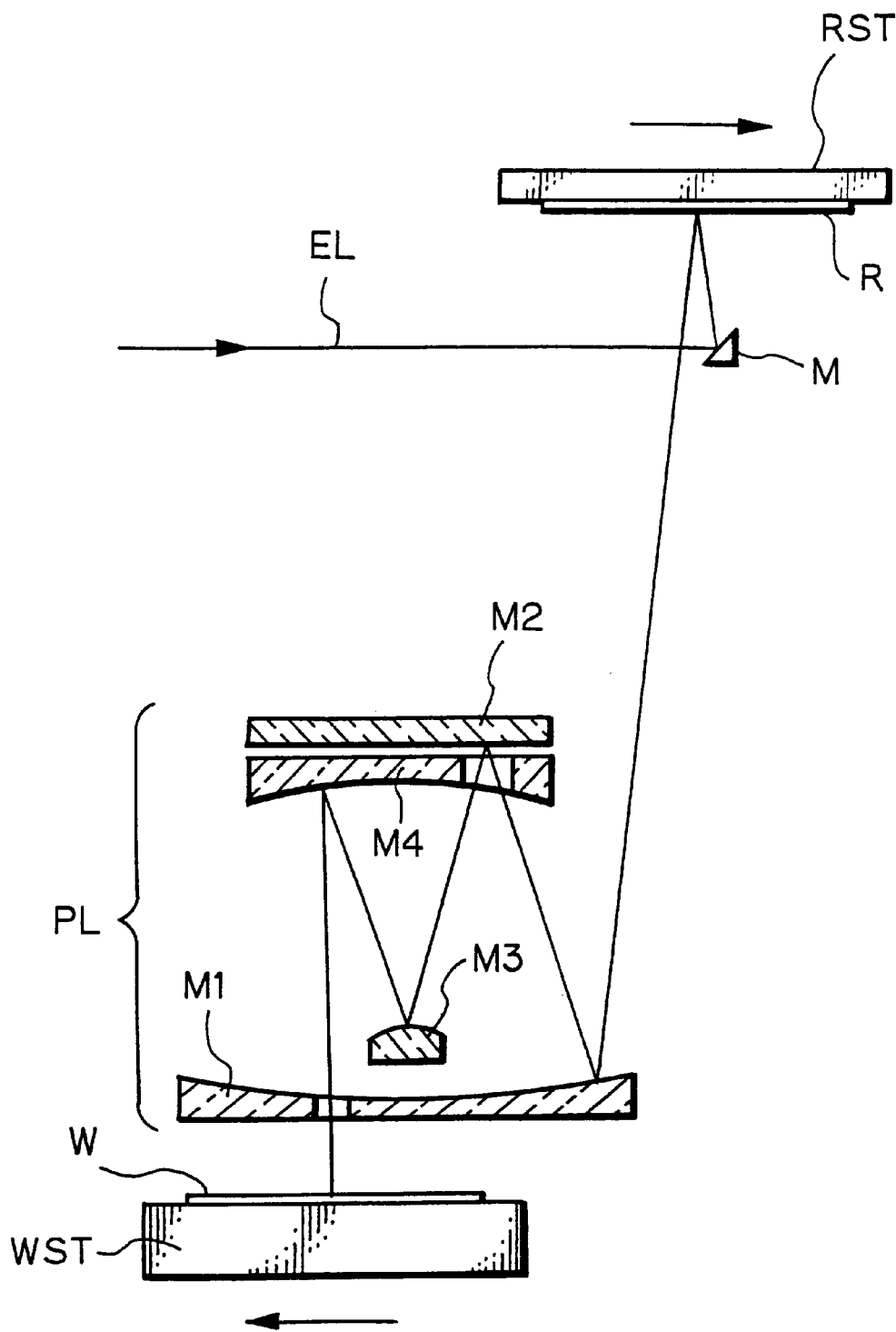
FIG. 6 is a schematic view showing a projection exposure apparatus for exposing a wafer in a step-and-scan system with EUV (Extreme Ultra Violet) in a soft X-rays region, to which the inspection device according to the present invention can be applied.

FIG. 6 shows an example of an exposure apparatus to which the inspection device according to the present invention can be applied. The exposure apparatus comprises a projection exposure apparatus which may be briefly configured in such a manner that a wafer W is exposed in a step-and-scan fashion to EUV (Extreme Ultra Violet) light in a soft X-ray region having an oscillating spectrum in the range of wavelengths of 5 to 15 nm as an exposing illumination light EL. Although not shown in FIG. 6, the illumination light EL can be oscillated from SOR (synchrotron radiation) or laser plasma light source.

In FIG. 6, a reticle R is irradiated with the illumination light EL at a predetermined incident angle $\Theta$ (e.g. approximately 50 mrad) from an optical illumination system (with only a bending mirror M shown in the drawing), and an illuminating region on the reticle R is so defined as to become circular. The reticle R may be configured such that a reflecting layer composed of multiple layers with molybdenum and silicon deposited alternately in layers is provided on its surface with a thin film absorbing EUV light and a pattern is formed on the thin film. The reticle R is held on a reticle stage RST and the illumination light EL reflected from the reticle R is projected onto the wafer W after passing through an optical projection system PL.

The optical projection system PL is configured so as to become non-telecentric on its reticle side and telecentric on its wafer side and is set to have a projection magnification of ¼. The optical projection system PL is further configured by a reflection system comprised of a plurality of optical reflection elements alone and an example of the reflection system as shown in FIG. 6 comprises 4 sheets of mirrors M1–M4, inclusive. The first mirror M1 and the fourth mirror M4 are formed so as for each of their reflecting surface to be non-spherical, while the second mirror M2 is formed so that its reflecting surface is flat and the third mirror M3 is formed so that its reflecting surface is spherical. Each of the first to fourth mirrors M1 to M4 is provided on its reflecting surface with a reflecting layer comprised of a multi-layer membrane with molybdenum and silicon deposited alternately in layers. Further, the fourth mirror M4 is provided at its portion with a hole that allows the illumination light EL to pass through and permits the illumination light EL reflected from the first mirror M1 to reach the second mirror M2.

The wafer W is loaded on a wafer stage WST in such a manner that it is transferred in the direction relative to the illumination light EL in synchronization with the movement of the reticle R while the reticle R is being transferred in the direction relative to the illumination light EL. Further, in order to transcribe a circuit pattern on the reticle R on the wafer W, each of the reticle stage RST and the wafer stage WST is driven at a velocity ratio in accordance with the magnification of the optical projection system PL by a drive system (not shown).

FIG. 6 illustrates the projection exposure apparatus using EUV light as the exposure apparatus. It is to be noted herein that the exposure apparatus is not limited to the projection exposure apparatus as shown in FIG. 6 and it may include a projection exposure apparatus using, as the optical projection system PL, e.g. an optical refraction system comprised of a plurality of optical refraction element systems only using e.g. ArF excimer laser beams having the wavelength of 193 nm or an optical reflection-refraction system comprised of a combination of at least one optical reflection element (e.g. concave mirror, mirror, etc.) with plural optical refraction elements.

The present invention can be applied to an exposure apparatus for use in manufacturing e.g. semiconductor elements, liquid crystal display elements, image pickup elements (e.g. CCD elements, etc.), thin film magnetic heads, reticles, etc. Further, the present invention is applicable to an optical system other than the optical projection system in the exposure apparatus, e.g. to an optical illumination system or an optical alignment system, etc. The exposure apparatus may comprise e.g. a scanning exposure apparatus of a type that a mask is transferred in synchronization with a board at a velocity ratio in accordance with the magnification of the optical projection system or a batch exposure apparatus of a type that an entire surface of a pattern formed on a mask is irradiated with an illuminating light in such a state that the mask and a board are stayed to transcribe the pattern on the board. Moreover, as the exposing light, there may be employed, in addition to X-rays (e.g. EUV light), e.g. g-rays, i-rays, KrF excimer laser beams, ArF excimer laser beams, $F_2$ laser beams and other ultraviolet rays. Furthermore, the present invention can be applied e.g. to an optical projection apparatus other than the exposure apparatus and to a variety of optical devices.

Furthermore, the present invention can be applied to the manufacturing of an exposure apparatus by effecting optical adjustment of the exposure apparatus by installing a main body of the exposure apparatus with an optical illumination system comprised of a plurality of optical elements and an optical projection system and at the same time by effecting general adjustment (e.g. electrical adjustment, action confirmation, etc.) by installing the main body of the exposure apparatus with the reticle stage and the wafer stage, each comprised of a large number of mechanical parts, and connecting wires and tubes thereto. Further, it is preferred that the exposure apparatus is manufactured in a clean room in which temperature, cleanliness, etc. are controlled.

It is to be understood that the present invention is not limited to the embodiments as described above and is construed as encompassing any and every modification and variation without departing from the spirit and scope of the invention.

The entire disclosure of Japanese Patent Application No. 9-229,142 filed on Aug. 26, 1997, including specification, claims, drawings and summary is incorporated herein by reference in its entirety.

What is claimed is:

1. An inspection method of optical device comprising:
    generating a diffraction light of light flux passed through the optical device as an object to be inspected;
    generating interference light between the diffracting light and the light flux which is not diffracted but is passed through the optical device;
    detecting an intensity of the interference light at a measurement point on a predetermined plane perpendicular to an optical axis of the optical device, and obtaining periodical variation thereof;
    obtaining phase difference information on the basis of the periodical variation of the intensity of the interference light; and
    obtaining information regarding a wavefront of the light flux on the basis of the obtained phase difference information.

2. A method according to claim 1, wherein:
    the intensity of the interference light is varied by a relative movement of the light flux passed through the optical device and a diffraction element which generates the diffraction light.

3. A method according to claim 2, wherein:
    the relative movement includes a movement of the diffraction element in a direction intersecting the optical axis of the optical device or in a direction parallel to the optical axis of the optical device.

4. A method according to claim 3, wherein:
    the diffraction element includes a pinhole, and the diffraction light is generated from the pinhole.

5. A method according to claim 1, wherein:
    the periodical variation of the intensity of the interference light is obtained at each of plural measurement points on the predetermined plane.

6. A method according to claim 1, wherein:
    the optical device as an object to be inspected includes an optical projection device for projecting an image of a pattern on a first plane onto a second plane.

7. A method according to claim 6, wherein:
    the optical projection device includes a projection optical system to be disposed between a mask having pattern and an object in an exposure apparatus which transfers the pattern on the object.

8. A method according to claim 7, wherein:
    a light flux incident in the optical device includes an exposing light to be projected onto the object through the mask and the projection optical system.

9. A method according to claim 8, wherein:
    the exposing light includes ultraviolet rays or X-rays.

10. A method according to claim 9, wherein:
    the projection optical system includes a reduced optical system comprised of a plurality of optical reflection elements.

11. A method for making an exposure apparatus which exposes an object with an illumination light through an optical system, comprising:
    generating a diffraction light of light flux passed through the optical system;
    generating interference light between the diffracting light and the light flux which is not diffracted but is passed through the optical device;
    detecting the interference light at a measurement point on a predetermined plane perpendicular to an optical axis of the optical device and obtaining periodical variation thereof;
    obtaining phase difference information on the basis of the periodical variation of the intensity of the interference light; and
    obtaining information regarding a wavefront of the light flux on the basis of the obtained phase difference information.

12. A method according to claim 11, further comprises:
    adjusting the optical system based on the information of the wavefront.

13. An inspection apparatus for an optical device comprising:
    a diffraction element disposed on an optical path of a light flux passed through the optical device; and
    a detection unit of which an incident surface is disposed on an optical path of diffraction light generated from the diffraction element to detect an intensity of interference light between the diffraction light and the light flux which is not diffracted but is passed through the optical device at a measurement point on a predetermined plane perpendicular to an optical axis of the optical device and to obtain periodical variation thereof, and the detection unit obtains intensity of the interference light in order to obtain information regarding a wavefront of the light flux.

14. An inspection apparatus according to claim 13, wherein:
    the detection unit includes a drive unit connected to the diffraction element.

15. An inspection apparatus according to claim 14, wherein:

the drive unit moves the diffraction element in a direction intersecting the optical axis of the optical device or in a direction parallel to the optical axis of the optical device.

16. An inspection apparatus according to claim 13, wherein:

the diffraction element includes a pinhole, and the diffraction light is generated from the pinhole.

17. An inspection apparatus according to claim 13, wherein:

the periodical variation of the intensity of the interference light is obtained at each of plural measurement points on the predetermined plane.

18. A method for making an exposure apparatus which transfers a pattern onto an object through a projection optical system, comprising:

generating a diffraction light of an illumination light having an exposure wavelength passed through the projection optical system;

generating an interference light between the diffraction light and the illumination light which is not diffracted but is passed through the projection optical system;

detecting an intensity of the interference light at a measurement point on a predetermined plane perpendicular to an optical axis of the projection optical system, and obtaining periodical variation thereof;

obtaining phase difference information on the basis of the periodical variation of the intensity of the interference light; and obtaining information regarding aberration of the projection optical system on the basis of the phase difference information.

19. A method according to claim 18, wherein:

the periodical variation of the intensity of the interference light is obtained at each of plural measurement points on the predetermined plane.

20. A method according to claim 19, wherein:

the intensity of the interference light is varied by a relative movement of the illumination light passed through the projection optical system and a diffraction element which generates the diffraction light.

21. A method according to claim 20, wherein:

the relative movement includes a movement of the diffraction element in a direction intersecting the optical axis of the projection optical system or in a direction parallel to the optical axis.

22. A method according to claim 21, wherein:

the diffraction element includes a pinhole, and the diffraction light is generated from the pinhole.

23. An exposure apparatus which transfers a pattern onto an object through a projection optical system, comprising:

a diffraction element disposed on a optical path of illumination light having an exposure wavelength passed through the projection optical system; and a detection unit of which an incident surface is disposed on a light path of a diffraction light generated from the diffraction element to detect an intensity of interference light between the diffracting light and the illuminating light which is not diffracted but is passed through the projection optical system at a measurement point on a predetermined plane perpendicular to an optical axis of the projection optical system to obtain periodical variation thereof, and the detection unit obtains phase difference information on the basis of the variation of the intensity of the interference light in order to obtain information regarding a wavefront of the illumination light.

24. An exposure apparatus according to claim 23, wherein:

the periodical variation of the intensity of the interference light is obtained at each of plural measurement points on the predetermined plane.

25. An exposure apparatus according to claim 23, wherein:

the detection unit includes a drive unit connected to the diffraction element, and the drive unit moves the diffraction element in a direction intersecting the optical axis of the projection optical system or in a direction parallel to the optical axis.

26. An exposure apparatus according to claim 23, wherein:

the diffraction element including a pinhole, and the diffraction light is generated from the pinhole.

* * * * *